(12) United States Patent
Ichiki et al.

(10) Patent No.: US 11,686,777 B2
(45) Date of Patent: Jun. 27, 2023

(54) POWER SOURCE CONTROL SYSTEM FOR VEHICLE

(71) Applicant: SUBARU CORPORATION, Tokyo (JP)

(72) Inventors: Toshiyuki Ichiki, Tokyo (JP); Hiroshi Abe, Tokyo (JP); Hiroshi Kusano, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 17/691,885

(22) Filed: Mar. 10, 2022

(65) Prior Publication Data

US 2022/0308119 A1    Sep. 29, 2022

(30) Foreign Application Priority Data

Mar. 24, 2021 (JP) ................. 2021-049693

(51) Int. Cl.
*G01R 31/392* (2019.01)
*G05F 3/26* (2006.01)
*G01R 31/36* (2020.01)
*G01R 31/388* (2019.01)
*G01R 31/00* (2006.01)
*G01R 31/389* (2019.01)
*B60K 6/28* (2007.10)

(52) U.S. Cl.
CPC .............. *G01R 31/392* (2019.01); *B60K 6/28* (2013.01); *G01R 31/007* (2013.01); *G01R 31/3648* (2013.01); *G01R 31/388* (2019.01); *G01R 31/389* (2019.01); *G05F 3/26* (2013.01)

(58) Field of Classification Search
None
See application file for complete search history.

(56) References Cited

U.S. PATENT DOCUMENTS

2013/0154654 A1* 6/2013 Bucsa ................. G01R 23/02
324/426
2019/0044345 A1 2/2019 Komiyama et al.

FOREIGN PATENT DOCUMENTS

JP    2019-509593 A    4/2019

* cited by examiner

*Primary Examiner* — Jas A Sanghera
(74) *Attorney, Agent, or Firm* — Troutman Pepper Hamilton Sanders LLP

(57) ABSTRACT

A power source control system for a vehicle is provided, which includes a traction motor, the system including a first battery that is a bipolar battery and is to be used as a power source for the traction motor; a second battery that is a bipolar battery different from the first battery; a mirror current generator circuit configured to generate a mirror current based on a current flowing through the first battery; a mirror current supply source circuit configured to cause the mirror current to flow through the second battery; and a diagnostic circuit configured to perform degradation diagnosis on the second battery on a basis of at least one of a voltage or a temperature of the second battery.

17 Claims, 6 Drawing Sheets

POWER SOURCE CONTROL SYSTEM FOR VEHICLE

CROSS-REFERENCE TO RELATED APPLICATION

The present application claims priority from Japanese Patent Application No. 2021-049693 filed on Mar. 24, 2021, the entire contents of which are hereby incorporated by reference.

BACKGROUND

The disclosure relates to a power source control system for a vehicle, and in particular, relates to a technology for a power source control system for a vehicle including a bipolar battery used as a traction battery serving as the power source of a traction motor.

Japanese Unexamined Patent Application Publication (Translation of PCT Application) No. 2019-509593 discloses using a bipolar solid-state battery (bipolar all solid-state battery) as the power source of an electric motor in a vehicle.

SUMMARY

An aspect of the disclosure provides a power source control system for a vehicle. The vehicle includes a traction motor. The power source control system includes a first battery, a second battery, a mirror current generator, a mirror current supply source, and a diagnostic unit. The first battery is a bipolar battery and is to be used as a power source for the traction motor. The second battery that is a bipolar battery different from the first battery. The mirror current generator is configured to generate a mirror current based on a current flowing through the first battery. The mirror current supply source is configured to cause the mirror current to flow through the second battery. The diagnostic unit is configured to perform degradation diagnosis on the second battery on the basis of at least one of a voltage or a temperature of the second battery.

An aspect of the disclosure provides a power source control system for a vehicle. The vehicle includes a traction motor. The power source control system includes a first battery, a second battery, and circuitry. The first battery is a bipolar battery and is to be used as a power source for the traction motor. The second battery that is a bipolar battery different from the first battery. The circuitry is configured to generate a mirror current based on a current flowing through the first battery. The circuitry is configured to cause the mirror current to flow through the second battery. The circuitry is configured to perform degradation diagnosis on the second battery on the basis of at least one of a voltage or a temperature of the second battery.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

An all solid-state battery is a battery expected to achieve high performance in cold regions. Examples of the all solid-state battery include a bipolar battery. In the bipolar battery, multiple cells can be coupled and provided in a single housing, unlike traditional liquid-based batteries in which one cell is provided in a single housing. This is advantageous in reducing the overall size and weight of the battery and reducing costs.

Battery degradation diagnosis is performed on a battery installed in a vehicle not only the installed battery being the bipolar battery. Generally, the voltage of each battery cell and the temperature at a plurality of locations within the battery are detected, and the diagnosis is performed on the basis of these detection results. If the bipolar battery is to be used as an in-vehicle battery, the bipolar battery is to include a large number of terminals for this degradation diagnosis, such as terminals for outputting the detection results of the voltages and temperatures.

However, providing such a large number of terminals increases the size and weight of the bipolar battery and increases costs, and thus there is a room for improvement to take the advantages of the bipolar battery, namely, small size, light weight and reduced costs.

It is desirable to reduce the size, weight and cost of a bipolar battery used as a traction power source.

A power source control system 1 for a vehicle according to an embodiment of the disclosure will be described below with reference to the accompanying drawings. Note that the following description is directed to an illustrative example of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following embodiment which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same numerals to avoid any redundant description.

Figure 1:
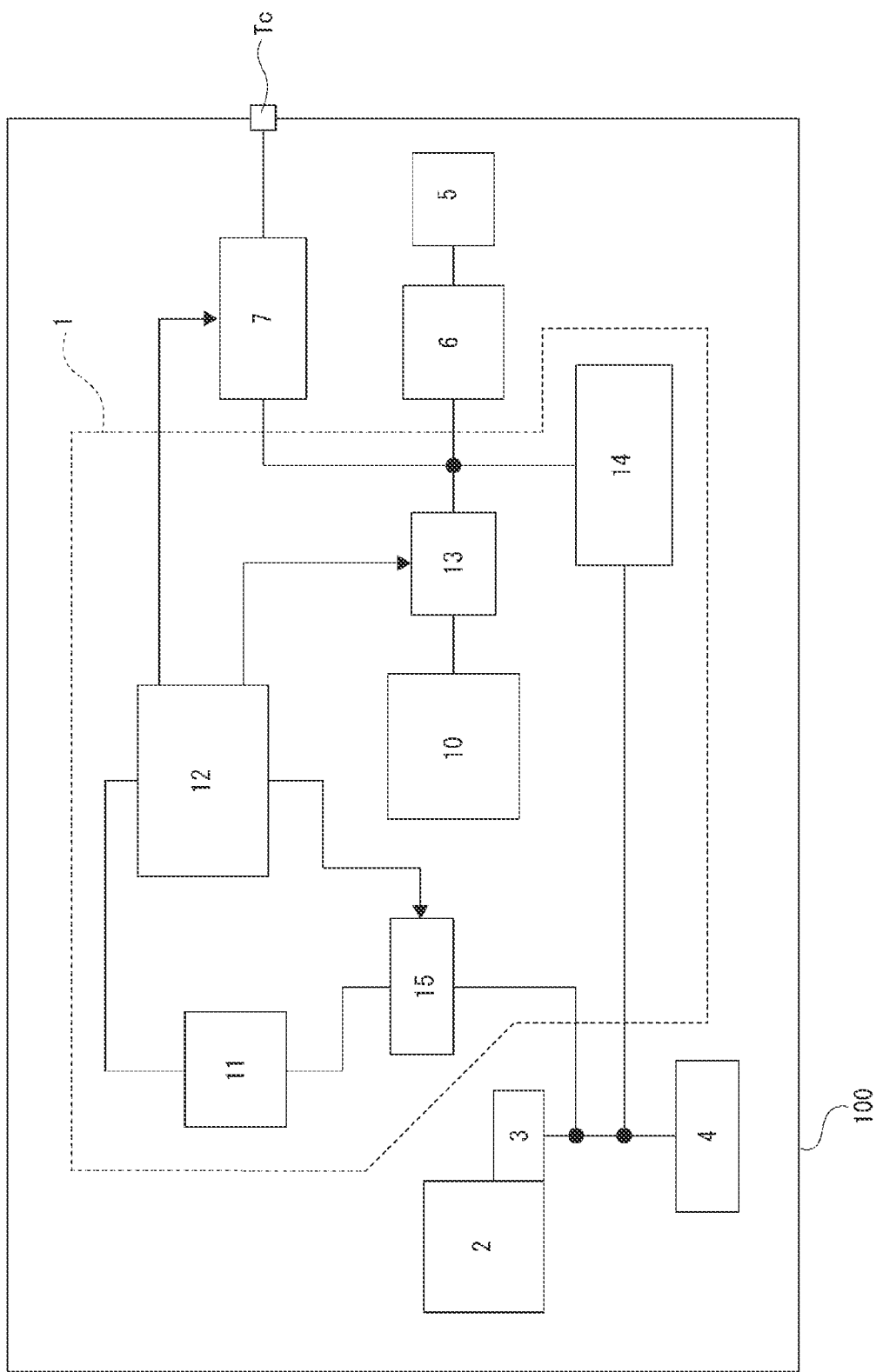
FIG. 1 illustrates the overall configuration of a vehicle including a power source control system according to an embodiment of the disclosure.

FIG. 1 is a diagram illustrating the overall configuration of a vehicle 100 including the power source control system 1.

In the present embodiment, the vehicle 100 is a plug-in hybrid vehicle and, as illustrated, includes an engine 2, a starter 3, an auxiliary battery 4, a traction motor 5, a motor drive unit 6, a charging circuit 7, and a charging terminal Tc, in addition to the power source control system 1.

The engine 2 is, for example, a gasoline engine or a diesel engine, and serves as a drive source for wheels (not illustrated) of the vehicle 100.

The starter 3 includes a motor for driving a crank shaft of the engine 2 and is configured to start the engine 2.

The auxiliary battery 4 is a battery provided as a power source for low-voltage electrical components including auxiliaries provided on the vehicle 100. A lead battery is used for the auxiliary battery 4, for example. In the present embodiment, the required voltage of the low-voltage electrical components is lower than the required voltage of the traction motor 5 and is, for example, 12 volts (V). Thus, the rated output voltage of the auxiliary battery 4 is also 12 V.

The low-voltage electrical components include the starter 3 described above, auxiliaries such as throttle valves and injectors of the engine 2, and various electronic circuit components such as a battery control unit (BCU) 12 of the power source control system 1 (described later).

The traction motor 5 is a motor provided as a drive source of the wheels of the vehicle 100. The motor drive unit 6 is, for example, an inverter and drives the traction motor 5.

The power source control system 1 controls the power source of the low-voltage electrical components and the traction motor 5 in the vehicle 100. As illustrated, the power source control system 1 includes a first battery 10, a second battery 11, the BCU 12, a relay 13, a DC/DC converter 14, and a switch 15.

The first battery 10 is a bipolar battery and used as a power source for the traction motor 5. The rated output voltage of the first battery 10 is higher than the rated output voltage of the auxiliary battery 4, and is, for example, from tens of V to several hundred V.

In the present embodiment, an all solid-state battery is used for the first battery 10. That is, in the present embodiment, the first battery 10 is a bipolar all solid-state battery.

Figure 2:
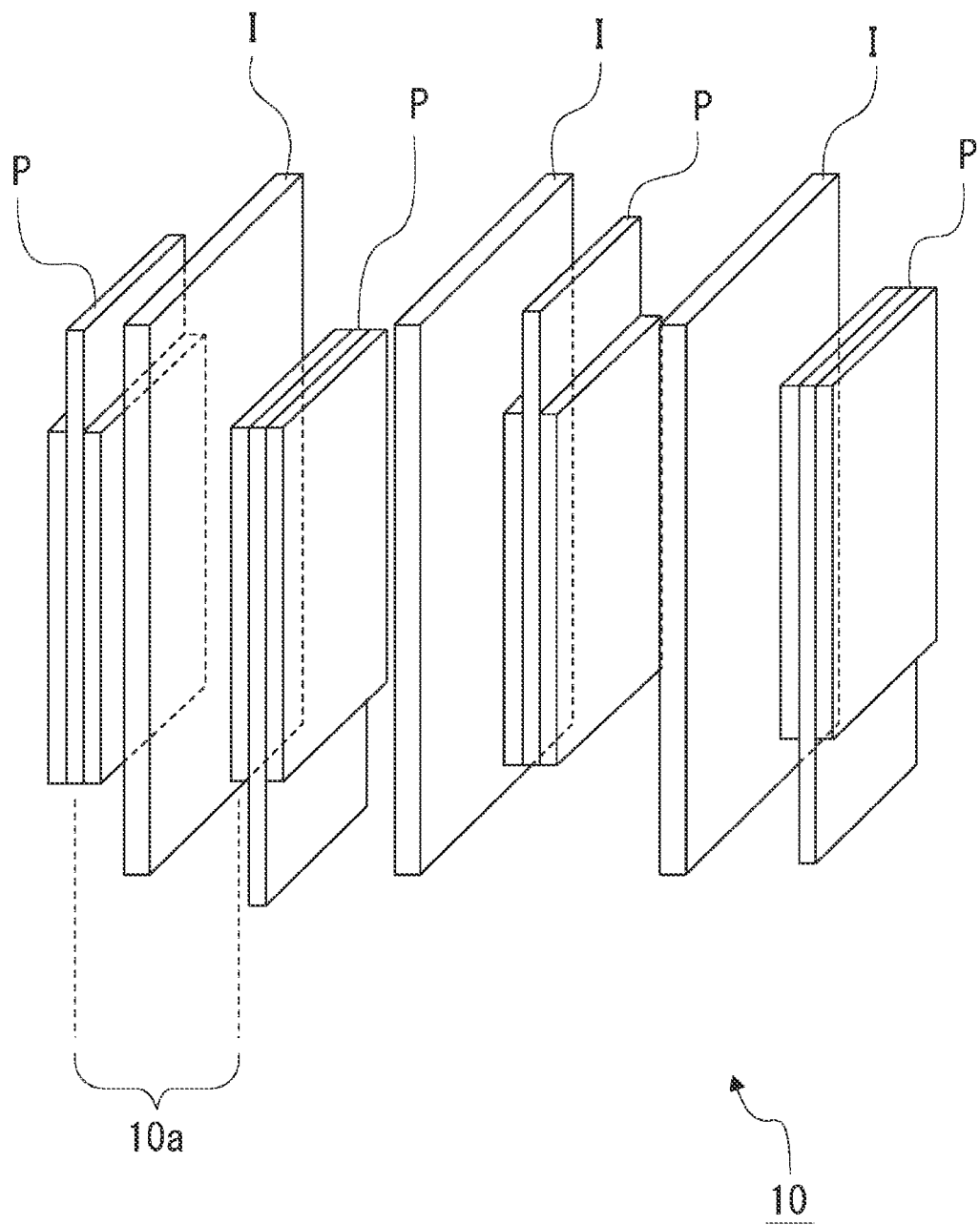
FIG. 2 is an explanatory view illustrating a schematic structure of a bipolar all solid-state battery.

The bipolar battery will be described with reference to FIG. 2.

The bipolar battery is a battery that has a bipolar electrode P. Here, the "bipolar electrode P" refers to an electrode in which an electrode used as a positive electrode and an electrode used as a negative electrode are formed on opposite sides of a single current collector foil. In one example, the bipolar electrode P is an electrode formed by applying a positive-electrode mixture slurry on the front of a current collector foil and a negative-electrode mixture slurry on the back of the same current collector foil, and then drying the slurries.

For example, when producing an electrode for a typical liquid-based battery such as a lithium-ion battery, aluminum is used as the current collector foil for the positive electrode, and a mixture containing a positive electrode active material, a conductive assistant, and a binder is applied on both sides of the current collector foil and then dried. Similarly, copper is used as the current collector foil for the negative electrode, and a mixture containing a negative electrode active material and a binder is applied on the both sides of the current collector foil and dried. That is, the electrode in the typical liquid-based battery such as the lithium-ion battery is formed by applying either one of the positive-electrode mixture slurry and the negative-electrode mixture slurry on the single current collector foil and then drying the slurry. The bipolar electrode P is formed by applying both of the positive-electrode mixture slurry and the negative-electrode mixture slurry on the single current collector foil and then drying the slurries. Examples of the positive electrode active material include lithium cobalt oxide or lithium iron phosphate. Examples of the negative electrode active material include graphite and lithium titanate.

Typically, a relatively high-voltage battery such as that used as the power source of the traction motor 5 is a battery in which cells (battery cells) are coupled in series (or in parallel). However, a typical liquid-based battery such as a lithium-ion battery, which is currently widely used, has a configuration in which individual cells in separate housings are coupled to each other.

The first battery 10, which is a bipolar battery, also includes a plurality of cells 10a and can be formed with a structure in which the cells 10a are coupled. In this structure, as illustrated in the drawings, electrolytes I of the cells 10a are coupled to each other within the same housing via the bipolar electrodes P. Thus, compared to the typical liquid-based battery, the first battery 10 can be made small and light, and costs can be reduced.

In the present embodiment, since the first battery 10 is a bipolar all solid-state battery, a solid-state electrolyte is used for the electrolyte I. Here, the concept of "solid-state" includes a gel.

In FIG. 1, the relay 13 includes an electromagnetic relay. The relay 13 is switched between an interrupted state in which the electrical coupling between the first battery 10 and other electrical circuits is interrupted, and an uninterrupted state in which the interrupted state is released.

When the relay 13 is set to the uninterrupted state, power can be supplied from the first battery 10 to the motor drive unit 6, that is, the first battery 10 can be used as a power source for the traction motor 5.

In the present embodiment, the vehicle 100 includes the charging terminal Tc and the charging circuit 7. When the relay 13 is set to the uninterrupted state, the charging circuit 7 can charge the first battery 10.

When the charging circuit 7 is coupled to a commercial AC power supply via the charging terminal Tc, the charging circuit 7 charges the first battery 10 on the basis of a voltage input from the commercial AC power supply.

In addition, when the relay 13 is set to the uninterrupted state, power can be supplied from the first battery 10 to the DC/DC converter 14.

The DC/DC converter 14 is a buck converter that steps down the output voltage of the first battery 10 to a voltage value equal to that of the rated output voltage of the auxiliary battery 4 described above, that is, to 12 V in the present embodiment, and outputs the voltage.

The output terminal of the DC/DC converter 14 is electrically coupled to the auxiliary battery 4.

With this configuration, the first battery 10 can be used as a power source to supply power to the above-described low-voltage electrical components and to charge the auxiliary battery 4, via the DC/DC converter 14.

The second battery 11 is a bipolar battery different from the first battery 10 and is provided as a battery used for diagnostics. In the present embodiment, a bipolar all solid-state battery is used for the second battery 11, similar to the first battery 10.

The BCU 12 includes, for example, a microcomputer including a central processing unit (CPU), a read only memory (ROM), and a random access memory (RAM). The CPU executes processing according to programs stored in the ROM to perform control related to the power source of the vehicle 100, in particular, control related to the first battery 10 and the second battery 11 in the present embodiment.

In one example, the BCU 12 controls switching the relay 13 between the interrupted state and the uninterrupted state described above. Additionally, the BCU 12 controls the charging operation of the first battery 10 by the charging circuit 7. For example, the BCU 12 controls the start and end of charging.

Note that the vehicle 100 may include, as the traction motor 5, a motor generator that also functions as a generator such that the first battery 10 can be charged by regenerative power of the motor generator. In this case, the BCU 12 also performs control of switching the motor generator between power running and regenerating.

The BCU 12 performs processing for diagnosing degradation of the second battery 11, which will be described again later.

Further, the BCU 12 controls the switch 15.

The switch 15 switches the electrical coupling between the output terminal of the second battery 11 and the output terminal of the auxiliary battery 4 between an interrupted state and an uninterrupted state. When the switch 15 is set to the uninterrupted state, the second battery 11 can be used as a power source for the low-voltage electrical components.

Although not illustrated in detail, the BCU 12 can calculate states of charge (SOC) of the first battery 10 and the auxiliary battery 4.

Figure 3:
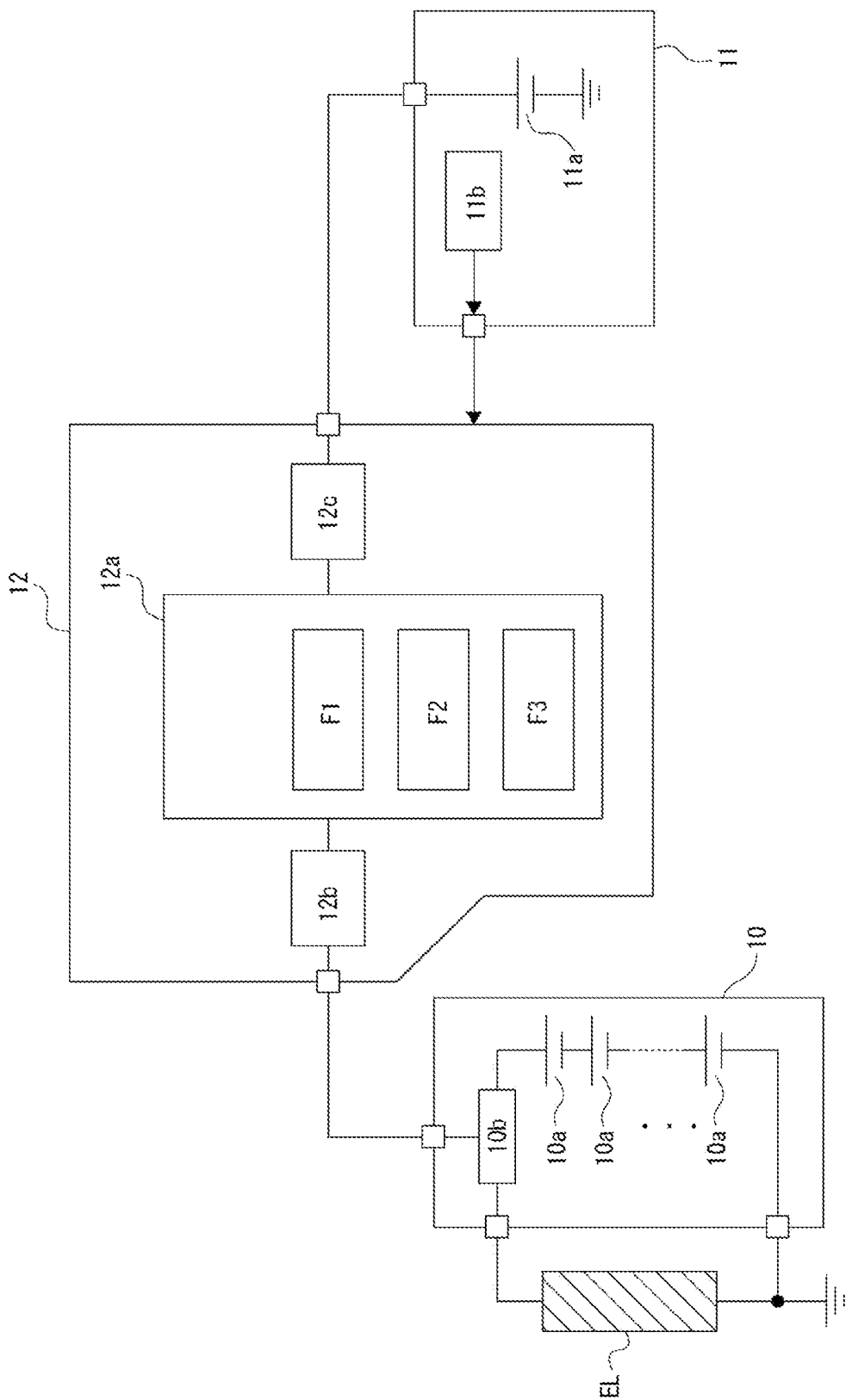
FIG. 3 illustrates a configuration for performing battery degradation diagnosis according to the embodiment.

FIG. 3 is a diagram illustrating a configuration for performing battery degradation diagnosis according to the present embodiment.

In the following description, the CPU of the BCU 12 is referred to as "CPU 12a".

FIG. 3 illustrates an example of a configuration for degradation diagnosis performed by the BCU 12, an example of a schematic internal configuration of the first battery 10, an electrical load EL of the first battery 10, and an example of a schematic internal configuration of the second battery 11.

Here, the load EL of the first battery 10 corresponds to the traction motor 5 and/or the DC/DC converter 14 in the configuration illustrated in FIG. 1.

The first battery 10 includes the plurality of cells 10a and a current detector 10b. In the present embodiment, the first battery 10 includes the cells 10a coupled in series.

The current detector 10b detects a current value of the current flowing through the first battery 10. The current detector 10b can detect a current value of the output current flowing from the first battery 10 toward the load EL. Further, when charging via the charging circuit 7 illustrated in FIG. 1, the current detector 10b detects the current value of the charging current with respect to the first battery 10.

The second battery 11 includes one or more of the cells 11a. A sensor 11b is provided in the housing of the second battery 11. The number of the cells 11a in the second battery 11 is basically assumed to be same as the number of cells 10a in the first battery 10, but may be different. For example, in a case where the size of the housing is to be reduced, fewer cells can be provided, and one cell may be provided as illustrated.

In the present embodiment, the second battery 11 is a battery in a separate housing from the first battery 10.

For example, the first battery 10 is attached to the vehicle 100 relatively rigidly under the floor of the cabin by a plurality of bolts. In contrast, the second battery 11 is attached at a predetermined position inside the vehicle 100 using an attachment/detachment mechanism such as a hook such that the second battery 11 can be removed relatively easily.

In the second battery 11, the sensor 11b broadly represents a sensor that is used to calculate a degradation evaluation value. The degradation evaluation value is an evaluation index for evaluating the degradation state of the second battery 11. In a case where an evaluation value based on the voltage of the second battery 11 is to be acquired as the degradation evaluation value, the sensor 11b includes a voltage sensor for detecting the voltage of the second battery 11, which is, for example, the voltage across both terminals of the second battery 11. In a case where an evaluation value based on the temperature of the second battery 11 is to be acquired as the degradation evaluation value, the sensor 11b includes a temperature sensor that detects the temperature of the second battery 11.

The BCU 12 includes the CPU 12a, an A/D converter 12b, and a D/A converter 12c as a configuration for the battery degradation diagnosis.

The A/D converter 12b converts a detection signal obtained by the current detector 10b from analog to digital to obtain a current value of the current flowing through the first battery 10, and outputs the current value to the CPU 12a.

FIG. 3 illustrates a mirror current generator F1, a diagnostic unit F2, and a controller F3 as the functional configurations of the CPU 12a. In the present embodiment, the functions of these configurations are implemented by software processing performed by the CPU 12a.

The mirror current generator F1 generates a mirror current based on the current flowing through the first battery 10. In one example, the mirror current generator F1 receives a current value of the current flowing through the first battery 10, which is obtained by the A/D converter 12b, and generates the mirror current based on this current value. Here, "mirror current" refers to a current having a current value that fluctuates in conjunction with the current flowing through the first battery 10.

Note that an example of a method for generating the mirror current is described below.

The mirror current generator F1 outputs a generated mirror current (which is a digital signal) to the D/A converter 12c. The D/A converter 12c converts the input mirror current into an analog signal and causes the mirror current to flow through the second battery 11. In one embodiment, the D/A converter 12c may serve a "mirror current supply source".

As described above, in the present embodiment, the mirror current of the current flowing through the first battery 10 is made to flow through the second battery 11, and this makes it possible to simulate the degradation state of the first battery 10 in the second battery 11.

Here, the mirror current is generated such that a usage mode of the first battery 10 is simulated in the second battery 11.

Here, the usage mode refers to how the battery is used, and, in one example, refers to how the battery is charged/discharged.

As an example, in terms of the temperature of the battery due to Joule heating, the mirror current may be generated such that the temperature of the first battery 10 and the temperature of the second battery 11 are equal.

In this case, the mirror current may be generated such that the following condition is satisfied:

(current of first battery 10)$^2$×(heat capacity of first battery 10)=(current of second battery 11)$^2$×(heat capacity of second battery 11)

As another example, the mirror current may be generated such that the SOC of the first battery 10 and the SOC of the second battery 11 are equal.

In this case, the mirror current may be generated such that the following condition is satisfied:

(current of first battery 10)/(initial power capacity of first battery 10)=(current of second battery 11)/ (initial power capacity of second battery 11)

Further, the mirror current may be generated as a current with a coefficient corresponding to the difference between the capacities or other characteristics of the first battery 10 and the second battery 11. In a case where, for example, the size and capacity of the cell 11a of the second battery 11 is 1/10 that of the cell 10a of the first battery 10, a current with a current value of 1/10 of the current value of the current flowing through the first battery 10 is generated as the mirror current.

As described above, the mirror current may be any mirror current generated such that the usage mode of the first battery 10 is simulated in the second battery 11.

Here, in a case where reference is to be made to a current value of the second battery 11 when generating the mirror current, the sensor 11b includes a current sensor that detects the current flowing through the second battery 11.

The diagnostic unit F2 performs degradation diagnosis of the second battery 11 on the basis of at least one of the voltage or the temperature of the second battery 11.

Here, "degradation diagnosis" refers to comparing at least a reference evaluation index value and a measured evaluation index value for each evaluation index related to the degradation state of a battery.

A known technique may be used for the method of degradation diagnosis of the battery. An example of such a technique is to perform diagnosis based on a capacity retention rate and a resistance increase rate of the battery.

In the degradation diagnosis based on the capacity retention rate, the capacity retention rate Rc (%) is calculated by [Equation 1] below for the second battery 11. Here, the degradation diagnosis based on the capacity retention rate Rc is assumed to be performed upon completion of charging the battery.

$$\text{capacity retention rate Rc} = \text{present full charge capacity (Ah)}/\text{reference full charge capacity} \times 100 \quad \text{[Equation 1]}$$

Note that the reference full charge capacity refers to a full charge capacity defined to be a reference in advance, such as a full charge capacity measured at the time of factory shipment (initial full charge capacity of the second battery 11).

Further, the full charge capacity in [Equation 1] is determined by [Equation 2] below.

$$\text{full charge capacity (Ah)} = \text{integrated amount of charging current (Ah)}/(\text{SOC after charging} - \text{SOC before charging}) \times 100 \quad \text{[Equation 2]}$$

According to [Equation 1] and [Equation 2] above, performing the degradation diagnosis based on the capacity retention rate Rc involves detecting the current flowing through the second battery 11 in order to calculate the present full charge capacity. Thus, in a case where the degradation diagnosis is to be performed based on the capacity retention rate Rc, the sensor 11b includes a current sensor that detects the current value of the current flowing through the second battery 11.

Note that the SOC of the second battery 11 can be calculated on the basis of the voltage value that is a value of the voltage across both terminals of the second battery 11 detected by the voltage sensor provided in the sensor 11b.

Here, in the present embodiment, the mirror current described above is used to charge the second battery 11. In one example, the second battery 11 is charged by a mirror current generated when the first battery 10 is charged by the charging circuit 7.

In this case, the diagnostic unit F2 calculates the capacity retention rate Rc described above in response to the second battery 11 being fully charged by the mirror current, that is, charging of the second battery 11 being completed, and performs degradation diagnosis of the second battery 11 based on the capacitance retention ratio Rc.

In this case, the diagnostic unit F2 determines, for example, whether the capacity retention rate Rc is less than a predetermined threshold value TH1 as the degradation diagnosis. If the capacity retention rate Rc is less than the threshold value TH1, the second battery 11 is degraded to a predetermined reference degradation level or greater. Thus, the CPU 12a performs processing corresponding to the degradation of the second battery 11. In one example, the CPU 12a performs processing for presenting notification information by way of visual notification using a warning light or a display provided in the vehicle 100, or presenting notification information by way of auditory notification using a speaker.

Note that the second battery 11 may also be charged by the charging circuit 7. In this case as well, the diagnostic unit F2 calculates the capacity retention rate Rc in response to the second battery 11 becoming fully charged and performs the degradation diagnosis of the second battery 11 based on the capacity retention rate Rc.

Note that, in some embodiments, when the second battery 11 is to be charged by the charging circuit 7, supply of the mirror current to the second battery 11 is stopped while the second battery 11 is being charged.

Next, the degradation diagnosis based on the resistance increase rate will be described.

In the degradation diagnosis based on the resistance increase rate, a resistance increase rate Rr (%) is calculated by [Equation 3] below for the second battery 11. The degradation diagnosis based on the resistance increase rate Rr is assumed to be performed at a predetermined timing, such as when the vehicle 100 starts up, when the vehicle 100 shuts down, or at constant intervals during startup of the vehicle 100.

$$\text{Resistance increase rate Rr} = \text{most recent battery resistance value } (\Omega)/\text{reference battery resistance value } (\Omega) \times 100 \quad \text{[Equation 3]}$$

The battery resistance value in Equation 3 is calculated by [Equation (4)] below.

$$\text{Battery resistance value} = \text{Average change of battery current}/\text{Average change of voltage across both terminals of battery} \quad \text{[Equation 4]}$$

In this case, the diagnostic unit F2 calculates the battery resistance value for the second battery 11 by [Equation 4] while the vehicle 100 is starting up. In other words, the diagnostic unit F2 acquires detection information of the current flowing through the second battery 11 and the voltage across both terminals of the second battery 11 over a predetermined period of time while the vehicle 100 is starting up, and calculates the battery resistance value for the second battery 11 by using [Equation 4].

Note that, to calculate the battery resistance value, the sensor 11b includes a current sensor and a voltage sensor in this case.

The diagnostic unit F2 in this case calculates the battery resistance value of the second battery 11 during startup of the vehicle 100 as described above. Further, the diagnostic unit F2 stores the last calculated battery resistance value of the second battery 11 in a predetermined storage device, such as the RAM of the BCU 12, as the "most recent battery resistance value" in [Equation 3]. Note that, in some embodiments, a non-volatile storage device is used as the predetermined storage device.

Then, when a condition for performing degradation diagnosis, such as when the vehicle 100 starts up, is satisfied, the diagnostic unit F2 in this case calculates the resistance increase rate Rr of the second battery 11 by using [Equation 3] on the basis of the most recent battery resistance value and the reference battery resistance value. Note that similar to the case of the above reference full charge capacity, the reference battery resistance is defined in advance with a battery resistance value, such as a battery resistance value measured at the time of factory shipment (initial battery resistance value of the second battery 11).

In addition, the diagnostic unit F2 determines whether the resistance increase rate Rr is greater than or equal to a predetermined threshold value TH2 as the degradation diagnosis. If the resistance increase rate Rr is greater than or equal to the threshold value TH2, the CPU 12a performs processing corresponding to the degradation of the second battery 11. In other words, as described above, for example, the CPU 12a performs processing for presenting the notification information of the degradation by way of visual notification or auditory notification in the vehicle 100.

Next, the controller F3 of the CPU 12a will be described.

The controller F3 performs processing for using the second battery 11 as an emergency power source for starting the engine 2.

In one example, in a case where the startup condition of the engine 2 is satisfied, and a set condition is satisfied, the controller F3 controls the switch 15 to change the switch 15 from the interrupted state to the uninterrupted state. The set condition may be that at least the auxiliary battery 4 is depleted of power, that is, that the SOC of the auxiliary battery 4 is less than a predetermined value. In the present embodiment, the set condition may be that both the auxiliary battery 4 and the first battery 10 are depleted of power. In a case where the startup condition of the engine 2 is satisfied, and the set condition is satisfied, the controller F3 controls the switch 15 to place the switch 15 in the uninterrupted state.

This allows the second battery 11 to supply the starter 3 with power as a substitute battery when the auxiliary battery 4 and the first battery 10 are depleted in a situation where the engine 2 is to be started.

3. Examples of Processing Procedures

Examples of processing procedures for implementing the battery degradation diagnostic technique according to the embodiment described above will be described with reference to the flowcharts of FIGS. 4 and 5.

Figure 4:
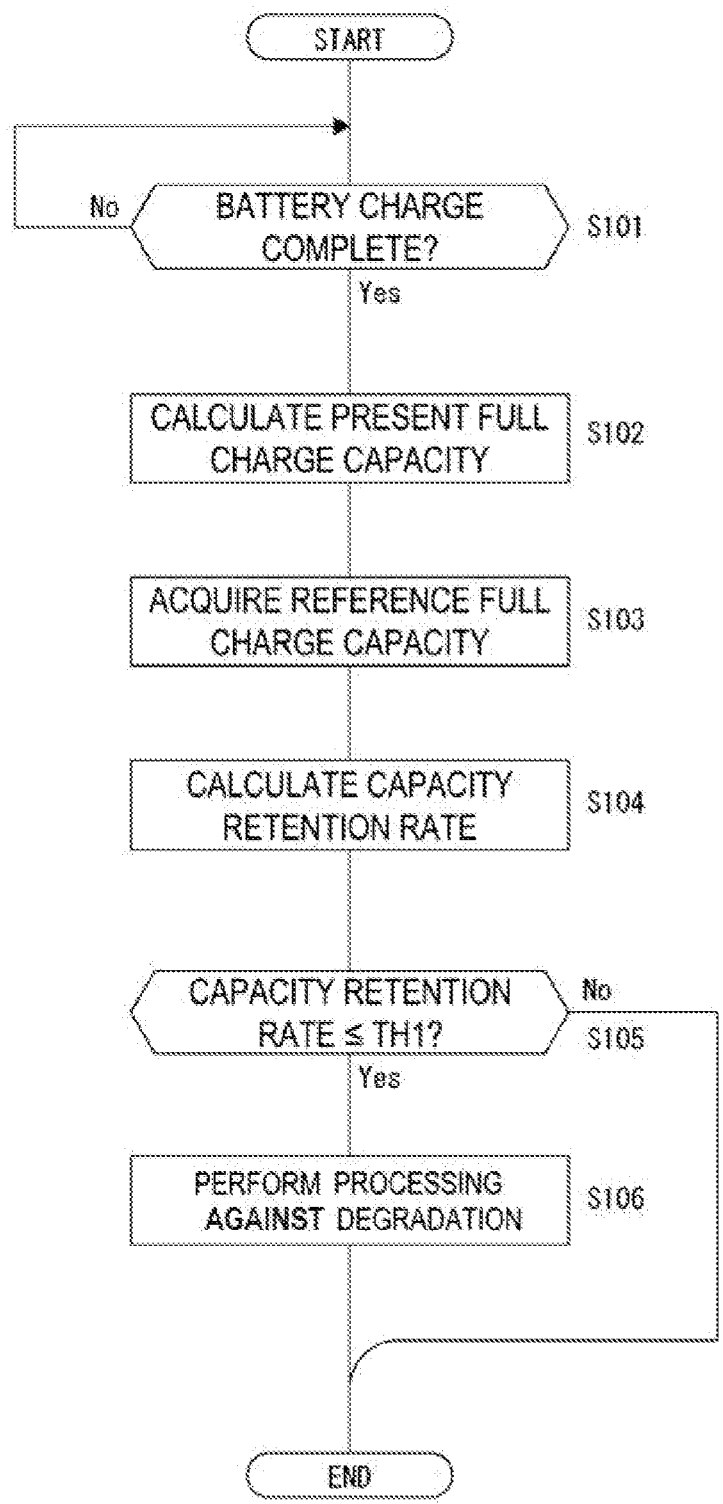
FIG. 4 is a flowchart illustrating an example of a processing procedure for performing degradation diagnosis based on capacity retention rate.
Figure 5:
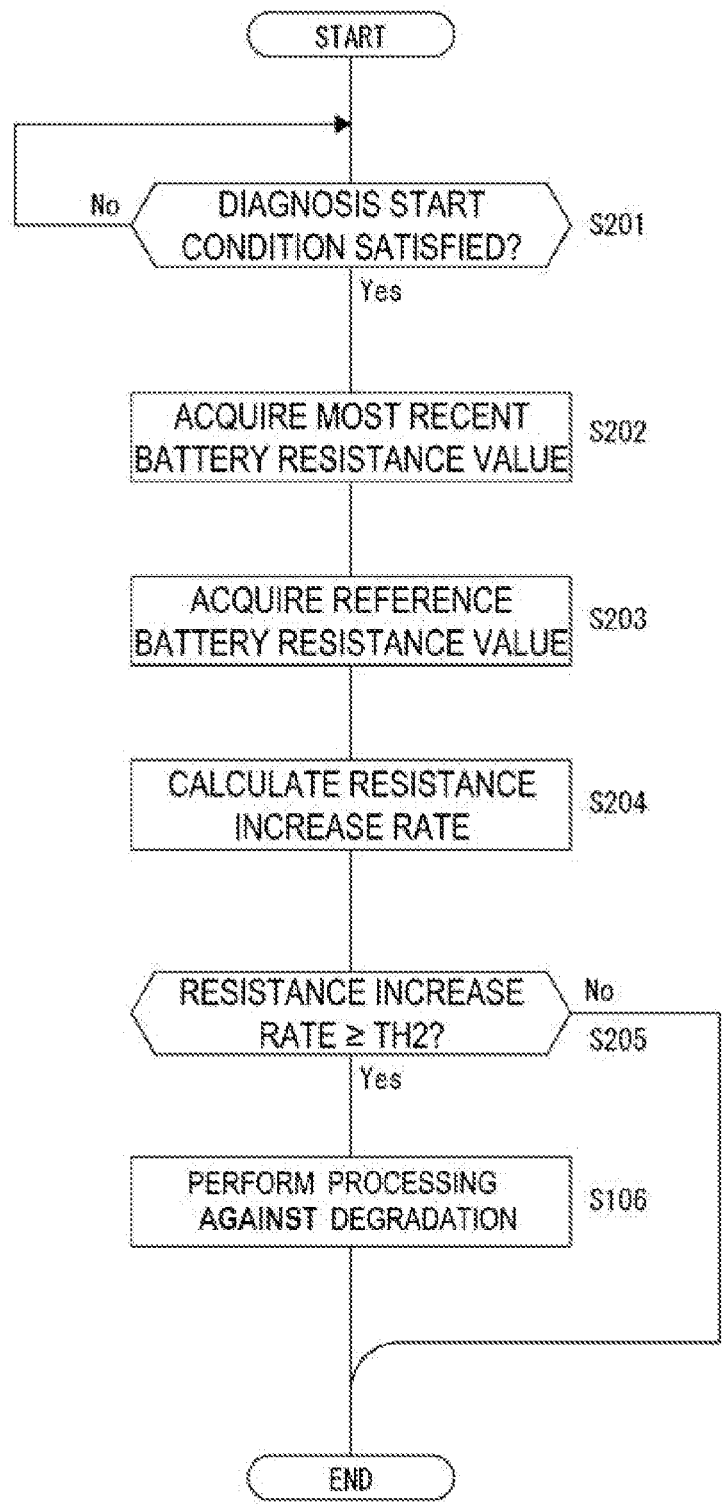
FIG. 5 is a flowchart illustrating an example of a processing procedure for performing degradation diagnosis based on resistance increase rate.

Note that the processing illustrated in FIGS. 4 and 5 is executed by the CPU 12a on the basis of a program stored in, for example, the ROM of the BCU 12.

FIG. 4 is a flowchart illustrating an example of a processing procedure for performing the degradation diagnosis based on the capacity retention rate Rc.

First, in step S101, the CPU 12a waits for battery charge completion. In other words, the CPU 12a waits for charge completion of the second battery 11.

In a case where the charging completion of the second battery 11 is confirmed, the CPU 12a proceeds to step S102 and calculates the present full charge capacity. In other words, the present full charge capacity is a present value of the full charge capacity calculated by using [Equation 2] above. Note that for the calculation of the full charge capacity, the "SOC before charging" in [Equation 2] is acquired in advance at the start timing of charging, and detection values of the charging current during charging are sequentially acquired in order to calculate of the "integrated amount of charging current".

In step S103 following step S102, the CPU 12a acquires the reference full charge capacity. In other words, the value for the "reference full charge capacity" in [Equation 1] is acquired.

Note that it is assumed that the value of the reference full charge capacity is stored in advance in a predetermined storage device such as the RAM of the BCU 12.

In step S104 following step S103, the CPU 12a calculates the capacity retention rate Rc. In other words, based on the present full charge capacity calculated in step S102 and the reference full charge capacity obtained in step S103, the capacity retention rate Rc of the second battery 11 is calculated by using [Equation 1].

In step S105 following step S104, the CPU 12a determines whether the capacity retention rate Rc is less than the threshold value TH1.

In a case where it is determined that the capacity retention rate Rc is less than the threshold value TH1, the CPU 12a proceeds to step S106 and performs processing against degradation, and ends the series of processing illustrated in FIG. 4. Here, as the processing against degradation and as described above, the CPU 12a performs processing for the presenting the notification information by way of visual notification using, for example, a warning light or a display provided in the vehicle 100, or presenting the notification information by way of auditory notification using, for example, a speaker.

On the other hand, in step S105, in a case where it is determined that the capacity retention rate Rc is not less than the threshold value TH1, the CPU 12a skips the processing in step S106 and ends the series of processing illustrated in FIG. 4.

FIG. 5 is a flowchart illustrating an example of a processing procedure for performing degradation diagnosis based on the resistance increase rate Rr.

In FIG. 5, in step S201, the CPU 12a waits for satisfaction of a diagnosis start condition.

As understood from the description above, the diagnosis start condition herein may be startup of the vehicle 100, shutdown of the vehicle 100, or reaching a predetermined timing after startup of the vehicle 100 (e.g., the diagnosis is performed every predetermined time).

In a case where satisfaction of the diagnosis start condition is confirmed, the CPU 12a proceeds to step S202 and obtains the most recent battery resistance value. In one example, the CPU 12a acquires the battery resistance value calculated most recently from among the battery resistance values of the second battery 11 calculated in advance by using [Equation 4] while the vehicle 100 is starting up.

In step S203 following step S202, the CPU 12a acquires the reference battery resistance value. In other words, the "reference battery resistance value" in [Equation 3] is acquired.

Note that the reference battery resistance value is stored in advance in a predetermined storage device such as the RAM of the BCU 12.

In step S204 following step S203, the CPU 12a calculates the resistance increase rate Rr. In one example, based on the most recent battery resistance value obtained in step S202 and the reference battery resistance value obtained in step S203, the resistance increase rate Rr of the second battery 11 is calculated by using [Equation 3].

In step S205 following step S204, the CPU 12a determines whether the resistance increase rate Rr is greater than or equal to the threshold value TH2.

In a case where it is determined that the resistance increase rate Rr is greater than or equal to the threshold value TH2, the CPU 12a performs the processing against degradation in step S106 and ends the series of processing illustrated in FIG. 5. Note that the processing against degradation in step S106 has already been described and thus duplicate description will be omitted.

On the other hand, in step S205, in a case where it is determined that the resistance increase rate Rr is not greater than or equal to the threshold value TH2, the CPU 12a skips the processing in step S106 and ends the series of processing illustrated in FIG. 5.

Figure 6:
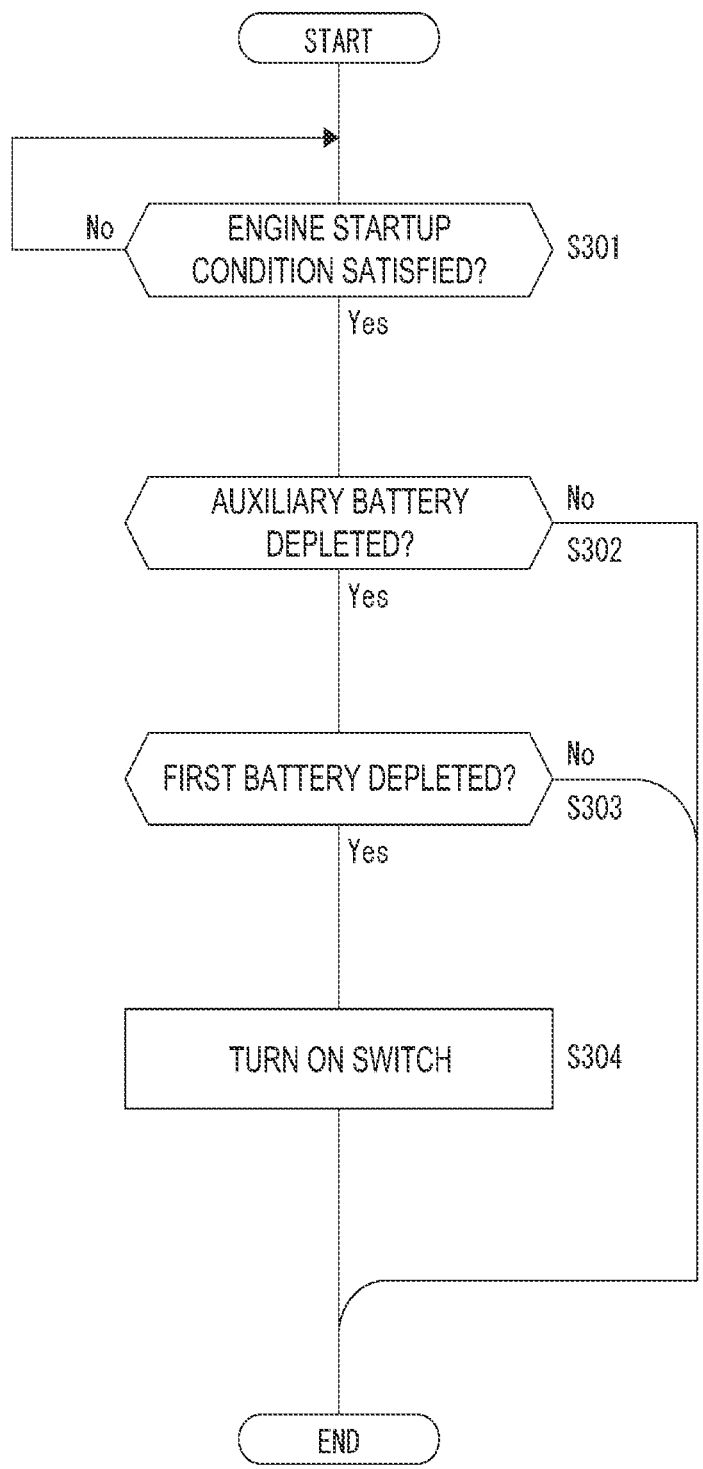
FIG. 6 is a flowchart illustrating processing corresponding to a controller according to the embodiment.

FIG. 6 is a flowchart illustrating processing corresponding to the above-described controller F3.

Note that, the processing illustrated in FIG. 6 is also performed by the CPU 12a on the basis of a program stored in the ROM of the BCU 12, for example.

In FIG. 6, in step S301, the CPU 12a waits until an engine startup condition is satisfied. In a case where the engine startup condition is satisfied, the CPU 12a proceeds to step S302 and determines whether the auxiliary battery 4 is depleted of power.

In a case where it is determined that the auxiliary battery 4 is not depleted of power, the CPU 12a ends the series of processing illustrated in FIG. 6.

On the other hand, in a case where it is determined that the auxiliary battery 4 is depleted of power, the CPU 12a proceeds to step S303 and determines whether the first battery 10 is depleted of power. In a case where it is determined that the first battery 10 is not depleted of power, the CPU 12a ends the series of processing illustrated in FIG. 6.

In a case where it is determined that the first battery 10 is depleted of power, the CPU 12a proceeds to step S304 and performs processing of turning on the switch 15, that is, processing of placing the switch 15 in the uninterrupted state described above, and ends the series of processing illustrated in FIG. 6.

Note that the above description is made on the assumption that the second battery 11 includes only one cell 11a, but the cell 11a of the second battery 11 may be provided in plurality. In this case, the capacity retention rate Rc and the resistance increase rate Rr described above can be calculated for each cell 11a.

Here, in a case where the capacity retention rate Rc is calculated for each cell 11a, the capacity retention rate Rc used for the degradation diagnosis, that is, the capacity retention rate Rc that is compared to the threshold value TH1 may be the average or median of the capacity retention rates Rc calculated for each cell 11a, or may be the minimum of the capacity retention rates Rc calculated for each cell 11a.

Further, in a case where the resistance increase rate Rr is calculated for each cell 11a, the resistance increase rate Rr used for the degradation diagnosis, that is, the resistance increase rate Rr that is compared with the threshold value TH2 may be the average or median of the resistance increase rates Rr calculated for each cell 11a, or may be the maximum of the capacity retention rates Rc calculated for each cell 11a.

Similar to the resistance increase rate Rr described above, in a case where degradation diagnosis based on the resistance value of the battery is performed, the temperature of the second battery 11 may be detected instead of detecting the current and voltage of the second battery 11. This is because the resistance value of the battery can be estimated from the battery temperature.

In this case, the sensor unit 11b includes a temperature sensor that detects the temperature of the second battery 11, and the diagnostic unit F2 estimates the battery resistance value as the degradation evaluation value of the second battery 11 on the basis of information on the temperature detected by the temperature sensor. In one example, the "most recent battery resistance value" in [Equation 3] is estimated. For example, based on the most recent battery resistance value estimated from the temperature in this way, the resistance increase rate Rr in [Equation 3] can be calculated and the degradation diagnosis can be performed in a manner similar to that described above.

For example, in a case where degradation diagnosis based temperature as described above is employed, if the second battery 11 includes a plurality of the cells 11a, the degradation evaluation value may be calculated for each cell 11a. In other words, a temperature sensor is provided for each cell 11a and the degradation evaluation value for each cell 11a, such as the resistance increase rate Rr for each cell 11a, is calculated on the basis of the detection information from the temperature sensors.

In this case, the degradation evaluation value used in the degradation diagnosis may be, for example, the average or median of the degradation evaluation values calculated for each cell 11a, or may be a value indicating the lowest evaluation value of the degradation evaluation values calculated for each cell 11a.

Note that in a case where the second battery 11 includes a plurality of the cells 11a, a voltage sensor, a current sensor, and a temperature sensor need not be provided for each cell 11a. For example, in a case where one of the cells 11a that more easily increases in temperature, that is, degrades more easily than the other cells 11a due to the structure of the second battery 11 can be identified, a sensor may be provided only for this cell 11a. The degradation evaluation value may be calculated on the basis of detection information from the dedicated sensor, and degradation diagnosis based on the degradation evaluation value may be performed.

3. Modifications

The disclosure is not limited to the foregoing embodiment, and various modifications may be made in the implementation stage without departing from the gist of the disclosure. Further, the embodiment includes various stages of the disclosure, and various technologies may be extracted by appropriately combining the features of the disclosure. For example, while the mirror current flowing through the second battery 11 is generated by executing software processing by a computer device as the CPU 12a in the above embodiment, the mirror current can also be generated by using an analog circuit such as a current mirror circuit. In this case, the "mirror current generator" and the "mirror current supply source" according to the embodiment of the disclosure are analog circuits.

In other words, for at least the "mirror current generator" according to the embodiment of the disclosure, the mirror current generator may be implemented by software processing executed by a computer device, or the mirror current generator may implemented by hardware in the form of, for example, an analog electronic circuit.

Further, while the first battery 10 and the second battery 11 are all solid-state batteries in the above embodiment, the first battery 10 and the second battery 11 may be any bipolar batteries and are not limited to all solid-state batteries.

Further, while the vehicle 100 of the embodiment is applied a plug-in hybrid vehicle, the disclosure is not limited to a plug-in hybrid vehicle and can be suitably applied to any hybrid vehicle. The disclosure is also widely applicable to electric vehicles (EV) that do not include an engine as the drive source of the wheels.

4. Summary of Embodiment

As described above, the power source control system 1 according to the embodiment is a power source control system for a vehicle 100 including a traction motor 5. The power source control system 1 includes: a first battery 10 that is a bipolar battery and is used as a power source for the traction motor; a second battery 11 that is a bipolar battery different from the first battery; a mirror current generator F1 configured to generate a mirror current based on a current flowing through the first battery 10; a D/A converter 12c configured to cause the mirror current to flow through the second battery 11; and a diagnostic unit F2 configured to perform degradation diagnosis on the second battery 11 on the basis of at least one of a voltage or a temperature of the second battery 11.

By causing a mirror current of the current flowing through the first battery 10 to flow through the second battery 11 as described above, the degradation state of the first battery 10 can be simulated in the second battery 11, and the degradation state of the first battery 10 can be estimated from the degradation state of the second battery 11.

Therefore, according to the above-described configuration, a terminal for degradation diagnosis can be eliminated from the bipolar battery serving as a traction power source, and it is possible to reduce the size and weight and reduce costs of the bipolar battery serving as a traction power source.

In the vehicle power source control system 1 of the embodiment, the first battery 10 and the second battery 11 are bipolar all solid-state batteries.

Since all solid-state batteries include a solid as the electrolyte constituting the cell (battery cell), the all solid-state battery can easily have a configuration in which cells are coupled and housed within a single housing. Additionally, using an all solid-state battery as the second battery 11 similar to the first battery 10 makes it easier to simulate the degradation state of the first battery 10 in the second battery 11.

Thus, adopting all solid-state batteries makes it possible to reduce the size and weight of the first battery 10 and can increase the accuracy of degradation diagnosis of the first battery 10 through the second battery 11.

In addition, in the vehicle power source control system 1 of the embodiment, the second battery 11 is provided in a separate housing from the first battery 10.

It is assumed that the first battery 10 serving as a drive source of the traction motor 5 is generally fixed below the floor of the cabin, for example. By providing the second battery 11 in a separate housing from the first battery 10 as described above, the second battery 11 can be mounted in a way that facilitates removal from the vehicle 100.

Thus, when degradation diagnosis confirms battery degradation in the vehicle 100 and when a dealer or the like is to perform a secondary diagnosis of the second battery 11, the second battery 11 can be more easily removed from the vehicle 100 and the second diagnosis can be more easily performed.

In addition, in the vehicle power source control system 1 of the embodiment, the mirror current generator F1 generates a mirror current such that the usage mode of the first battery 10 is simulated in the second battery 11.

Generating the mirror current such that the usage mode of the first battery 10 is simulated in the second battery 11 as described above makes it possible to appropriately simulate the degradation state of the first battery 10 in the second battery 11.

Thus, the degradation state of the first battery 10 can be appropriately estimated from the degradation state of the second battery 11.

Further, According the embodiment, the vehicle 100 is a hybrid vehicle including a traction motor 5 and an engine 2 as the drive source of the wheels, and the second battery 11 is configured to supply power to a starter 3 of the engine 2.

With this configuration, the second battery 11 can also be used as a power source for engine startup.

Thus, engine startup can be performed even in a case where the power source used for engine startup is depleted of power, thereby improving safety.

In addition, since the degradation of the second battery 11 progresses when the second battery 11 is used for engine startup, it is possible to perform safer diagnosis as the degradation diagnosis using the second battery 11.

The invention claimed is:

1. A power source control system for a vehicle, the vehicle comprising a traction motor, the power source control system comprising:
    a first battery that is a bipolar battery and is to be used as a power source for the traction motor;
    a second battery that is a bipolar battery different from the first battery;
    a mirror current generator configured to generate a mirror current based on a current flowing through the first battery;
    a mirror current supply source configured to cause the mirror current to flow through the second battery; and
    a diagnostic unit configured to perform degradation diagnosis on the second battery on a basis of at least one of a voltage or a temperature of the second battery.

2. The power source control system for the vehicle according to claim 1, wherein the first battery and the second battery are bipolar all solid-state batteries.

3. The power source control system for the vehicle according to claim 1, wherein, in the vehicle, the second battery is to be provided in a separate housing from the first battery.

4. The power source control system for the vehicle according to claim 2, wherein, in the vehicle, the second battery is to be provided in a separate housing from the first battery.

5. The power source control system for the vehicle according to claim 1, wherein the mirror current generator generates the mirror current such that a usage mode of the first battery is simulated in the second battery.

6. The power source control system for the vehicle according to claim 2, wherein the mirror current generator generates the mirror current such that a usage mode of the first battery is simulated in the second battery.

7. The power source control system for the vehicle according to claim 3, wherein the mirror current generator generates the mirror current such that a usage mode of the first battery is simulated in the second battery.

8. The power source control system for the vehicle according to claim 4, wherein the mirror current generator generates the mirror current such that a usage mode of the first battery is simulated in the second battery.

9. The power source control system for the vehicle according to claim 1, wherein
the vehicle is a hybrid vehicle comprising the traction motor and an engine as a drive source of wheels, and
the second battery is configured to supply power to a starter of the engine.

10. The power source control system for the vehicle according to claim 2, wherein
the vehicle is a hybrid vehicle comprising the traction motor and an engine as a drive source of wheels, and
the second battery is configured to supply power to a starter of the engine.

11. The power source control system for the vehicle according to claim 3, wherein
the vehicle is a hybrid vehicle comprising the traction motor and an engine as a drive source of wheels, and
the second battery is configured to supply power to a starter of the engine.

12. The power source control system for the vehicle according to claim 4, wherein
the vehicle is a hybrid vehicle comprising the traction motor and an engine as a drive source of wheels, and
the second battery is configured to supply power to a starter of the engine.

13. The power source control system for the vehicle according to claim 5, wherein
the vehicle is a hybrid vehicle comprising the traction motor and an engine as a drive source of wheels, and
the second battery is configured to supply power to a starter of the engine.

14. The power source control system for the vehicle according to claim 6, wherein
the vehicle is a hybrid vehicle comprising the traction motor and an engine as a drive source of wheels, and
the second battery is configured to supply power to a starter of the engine.

15. The power source control system for the vehicle according to claim 7, wherein
the vehicle is a hybrid vehicle comprising the traction motor and an engine as a drive source of wheels, and
the second battery is configured to supply power to a starter of the engine.

16. The power source control system for the vehicle according to claim 8, wherein
the vehicle is a hybrid vehicle comprising the traction motor and an engine as a drive source of wheels, and
the second battery is configured to supply power to a starter of the engine.

17. A power source control system for a vehicle, the vehicle comprising a traction motor, the power source control system comprising:
a first battery that is a bipolar battery and is to be used as a power source for the traction motor;
a second battery that is a bipolar battery different from the first battery; and
circuitry configured to
generate a mirror current based on a current flowing through the first battery,
cause the mirror current to flow through the second battery, and
perform degradation diagnosis on the second battery on a basis of at least one of a voltage or a temperature of the second battery.

* * * * *